United States Patent
Chidambarrao et al.

(10) Patent No.: US 8,237,150 B2
(45) Date of Patent: Aug. 7, 2012

(54) NANOWIRE DEVICES FOR ENHANCING MOBILITY THROUGH STRESS ENGINEERING

(75) Inventors: Dureseti Chidambarrao, Weston, CT (US); Xiao H. Liu, Briarcliff Manor, NY (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 614 days.

(21) Appl. No.: 12/417,808

(22) Filed: Apr. 3, 2009

(65) Prior Publication Data
US 2010/0252800 A1 Oct. 7, 2010

(51) Int. Cl.
*H01L 29/66* (2006.01)
*H01L 21/20* (2006.01)

(52) U.S. Cl. ............... 257/9; 257/12; 257/18; 257/19; 257/24; 257/213; 257/746; 257/E29.024; 257/E29.068; 257/E29.168; 257/E27.062; 257/E21.09; 257/E21.632; 438/197; 438/199; 438/666; 977/762; 977/938; 977/957

(58) Field of Classification Search ............... 257/9, 14, 257/18–19, 12, 24, 213, 290, 296, 315, 414, 257/429, 746, 784, 369, E29.024, E29.068, 257/E23.154, E29.168, E27.062, E21.062, 257/E21.002, E21.09, E21.632, E21.17, E21.32, 257/E21.126, E21.127, E21.229, E21.252, 257/E21.253, E21.267, E29.255, E21.409, 257/E21.575; 438/49, 197, 199, 20, 666; 977/762, 938, 957

See application file for complete search history.

(56) References Cited

U.S. PATENT DOCUMENTS

| | | | |
|---|---|---|---|
| 6,231,744 B1 | 5/2001 | Ying et al. | |
| 6,248,674 B1 | 6/2001 | Kamins et al. | |
| 6,656,573 B2 | 12/2003 | Chen et al. | |
| 6,720,240 B2 | 4/2004 | Gole et al. | |
| 6,798,000 B2 | 9/2004 | Luyken | |
| 6,831,017 B1 | 12/2004 | Li et al. | |
| 6,841,235 B2 | 1/2005 | Weiner et al. | |
| 6,843,902 B1 | 1/2005 | Penner et al. | |
| 6,882,051 B2 | 4/2005 | Majumdar et al. | |

(Continued)

OTHER PUBLICATIONS

Chang et al., "CMOS Circuit Performance Enhancement by Surface Orientation Optimization", IEEE Transactions on Electron Devices, Oct. 2004, pp. 1621-1627, vol. 51.

*Primary Examiner* — Matthew Reames
*Assistant Examiner* — Ermias Woldegeorgis
(74) *Attorney, Agent, or Firm* — Scully, Scott, Murphy & Presser, P.C.; H. Daniel Schnurmann

(57) ABSTRACT

A p-type semiconductor nanowire transistor is formed on the first semiconductor nanowire and an n-type semiconductor nanowire transistor is formed on the second semiconductor nanowire. The first and second semiconductor nanowires have a rectangular cross-sectional area with different width-to-height ratios. The type of semiconductor nanowires for each semiconductor nanowire transistor is selected such that top and bottom surfaces provide a greater on-current per unit width than sidewall surfaces in a semiconductor nanowire having a greater width-to-height ratio, while sidewall surfaces provide a greater on-current per unit width than top and bottom surfaces in the other semiconductor nanowire having a lesser width-to-height ratio. Different types of stress-generating material layers may be formed on the first and second semiconductor nanowire transistors to provide opposite types of stress, which may be employed to enhance the on-current of the first and second semiconductor nanowire transistors.

23 Claims, 8 Drawing Sheets

U.S. PATENT DOCUMENTS

| | | |
|---|---|---|
| 6,897,098 B2 | 5/2005 | Hareland et al. |
| 6,969,679 B2 | 11/2005 | Okamura et al. |
| 7,067,328 B2 | 6/2006 | Dubrow et al. |
| 7,067,341 B2 | 6/2006 | Mascolo et al. |
| 7,081,293 B2 | 7/2006 | Weiner |
| 7,135,728 B2 | 11/2006 | Duan et al. |
| 7,164,209 B1 | 1/2007 | Duan et al. |
| 7,176,505 B2 | 2/2007 | Rueckes et al. |
| 7,182,996 B2 | 2/2007 | Hong |
| 7,183,568 B2 | 2/2007 | Appenzeller et al. |
| 7,189,635 B2 | 3/2007 | Sharma |
| 7,208,094 B2 | 4/2007 | Islam et al. |
| 7,211,464 B2 | 5/2007 | Lieber et al. |
| 7,217,946 B2 | 5/2007 | Fraboulet et al. |
| 2002/0014667 A1 | 2/2002 | Shin et al. |
| 2005/0167655 A1* | 8/2005 | Furukawa et al. .............. 257/20 |
| 2006/0105513 A1 | 5/2006 | Afzali-Ardakani et al. |
| 2006/0151844 A1 | 7/2006 | Avouris et al. |
| 2008/0272366 A1* | 11/2008 | Moon et al. ..................... 257/24 |
| 2009/0224230 A1* | 9/2009 | Pesetski et al. ................. 257/24 |

* cited by examiner

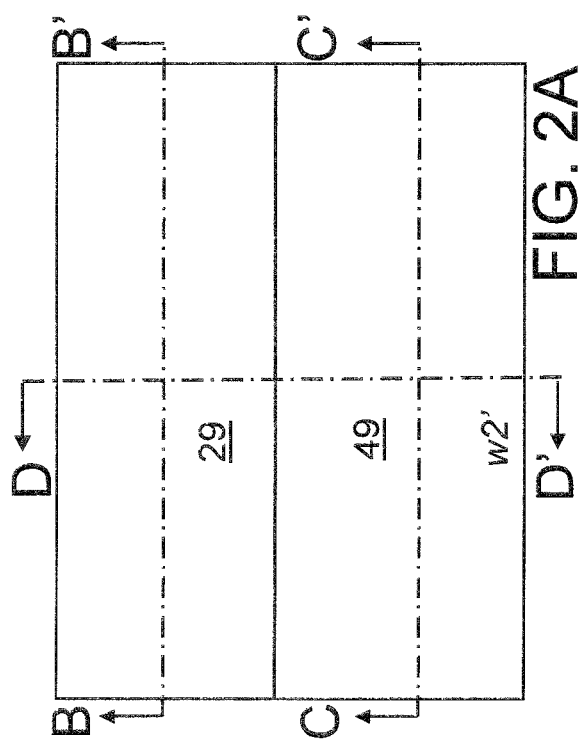
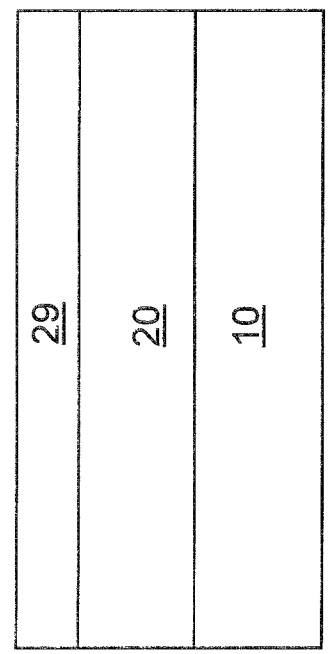
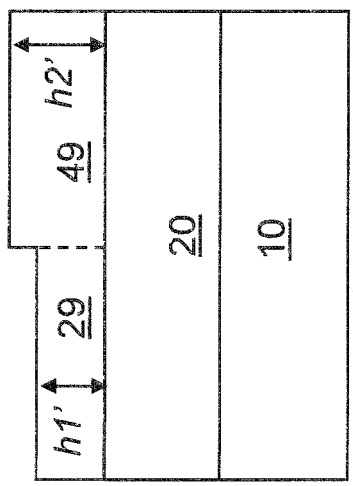
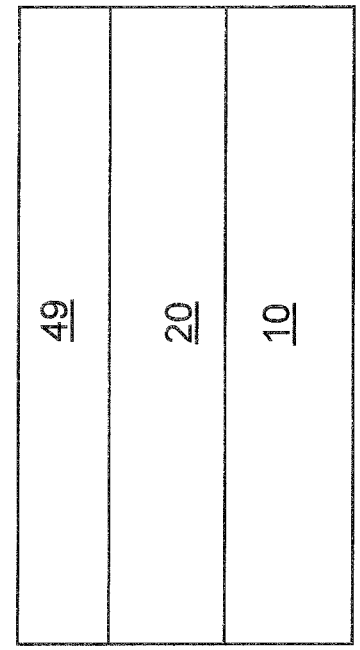

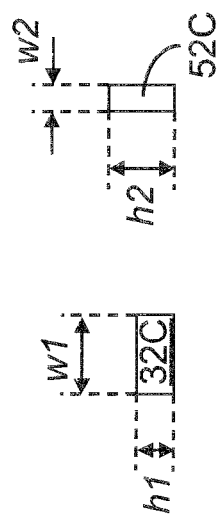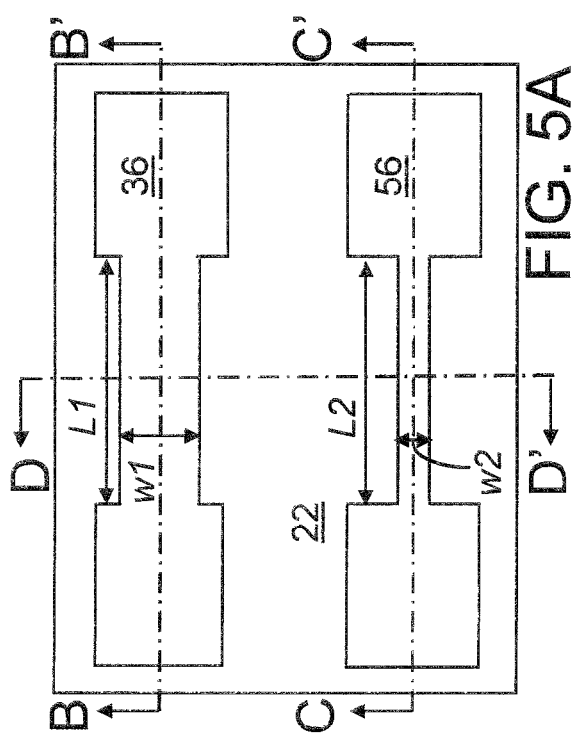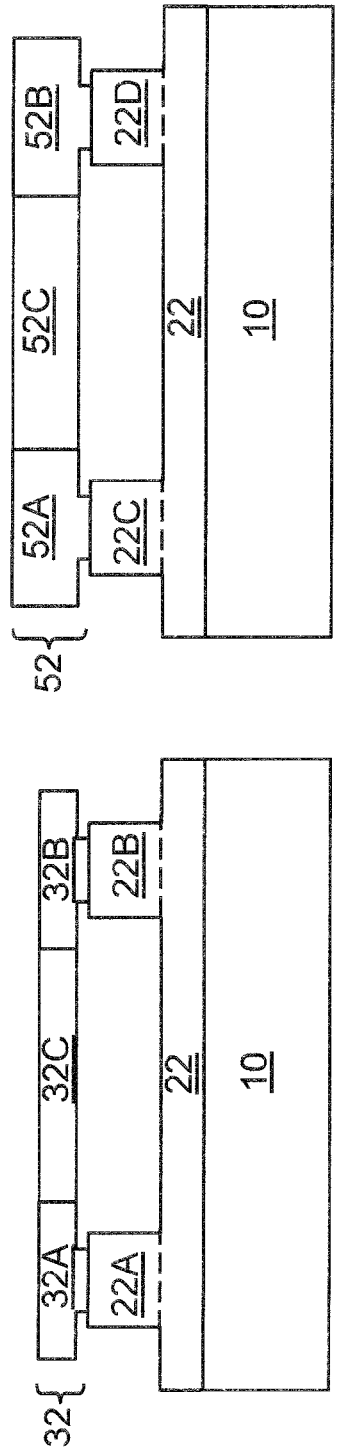

NANOWIRE DEVICES FOR ENHANCING MOBILITY THROUGH STRESS ENGINEERING

FIELD OF THE INVENTION

The present invention relates to semiconductor devices, and particularly to nanowires for enhancing orientation-dependent mobility effect and methods of manufacturing the same.

BACKGROUND OF THE INVENTION

A semiconductor nanowire refers to a semiconductor wire having transverse lateral and vertical dimensions of the order of a nanometer ($10^{-9}$ meter) or tens of nanometers. Typically, the transverse lateral dimension and the vertical dimension are less than 20 nm.

The limitation on the lateral dimension applies to the transverse lateral dimension (the width) and the vertical lateral dimension (the height). The longitudinal lateral dimension (the length) of the semiconductor nanowire is unlimited, and may be, for example, from 1 nm to 1 mm. When the lateral dimensions of the semiconductor nanowire is less than tens of nanometers, quantum mechanical effects become important. As such, semiconductor nanowires are also called semiconductor quantum wires.

The transverse lateral dimension of a semiconductor nanowire is currently sublithographic, i.e., may not be printed by a direct image transfer from a photoresist that is patterned by a single exposure. As of 2008, the critical dimension, i.e., the smallest printable dimension that may be printed by lithographic methods, is about 35 nm. Dimensions less than the critical dimension are called sublithographic dimensions. At any given time, the critical dimension and the range of the sublithographic dimension are defined by the best available lithographic tool in the semiconductor industry. In general, the critical dimension and the range of the sublithographic dimension decreases in each successive technology node and established by a manufacturing standard accepted across the semiconductor industry.

A semiconductor nanowire enables enhanced control of the charge carriers along the lengthwise direction through a complete encirclement of the cross-sectional area of the semiconductor nanowire by a gate dielectric and a gate electrode. The charge transport along the semiconductor nanowire by the gate electrode is better controlled in a semiconductor nanowire device than in a fin field effect transistor (finFET) because of the complete encirclement of the semiconductor nanowire.

For high performance complementary metal-on-semiconductor (CMOS) circuit, high performance p-type semiconductor nanowire devices and n-type semiconductor devices that provide high on-current and low off-current are desired.

SUMMARY OF THE INVENTION

In the present invention, first and second semiconductor nanowire are employed to enhance the on-current for a p-type semiconductor nanowire transistor and an n-type semiconductor nanowire transistor. Each of the first and second semiconductor nanowires has a rectangular cross-sectional area and the same surface orientations for horizontal surfaces and vertical sidewalls. The width-to-height ratios are set differently for the first and second semiconductor nanowires. A p-type semiconductor nanowire transistor is formed on the first semiconductor nanowire and an n-type semiconductor nanowire transistor is formed on the second semiconductor nanowire. Sensitivity of charge carrier mobility to externally applied stress along the longitudinal direction of a semiconductor nanowire is affected by the aspect ratio of the cross-sectional area of a semiconductor nanowire, i.e., the ratio of the height to the width of the semiconductor nanowire as well as the crystallographic orientations of the semiconductor nanowire. In some cases, the sidewall surfaces of a semiconductor nanowire provide a higher charge carrier mobility per width for one type of charge carriers, e.g., holes or electrons, than the top or bottom surface of the semiconductor nanowire. In some other cases, the opposite is the case. Different types of stress-generating material layers may be formed on the first and second semiconductor nanowire transistors to apply opposite types of stress. Combined with the engineering of aspect ratios to provide more surfaces having higher susceptibility to the applied stress, the present invention enhances the on-current of the first and second semiconductor nanowire transistors far more than what the external stress can achieve without engineering of geometric shapes of the semiconductor nanowire.

According to an aspect of the present invention, a semiconductor structure includes a first semiconductor nanowire having a first substantially rectangular cross-sectional area and a first height and located on a substrate; and a second semiconductor nanowire having a second substantially rectangular cross-sectional area and a second height and located on the substrate, wherein the second height is greater than the first height.

According to another aspect of the present invention, a method of forming a semiconductor structure includes: forming a first semiconductor nanowire having a first substantially rectangular cross-sectional area and a first height and located on a substrate; and forming a second semiconductor nanowire having a second substantially rectangular cross-sectional area and a second height and located on the substrate, wherein the second height is greater than the first height.

BRIEF DESCRIPTION OF THE DRAWINGS

FIG. 2A is a top-down view of the exemplary semiconductor structure after formation of a first top semiconductor portion having a lesser thickness and a second top semiconductor portion having a greater thickness. FIG. 2B is a vertical cross-sectional view of the exemplary semiconductor structure along the plane B-B' at the step corresponding to FIG. 2A. FIG. 2C is a vertical cross-sectional view of the exemplar semiconductor structure along the plane C-C' at the step corresponding to FIG. 2A. FIG. 2D is a vertical cross-sectional view of the exemplary semiconductor structure along the plane D-D' at the step corresponding to FIG. 2A.

FIG. 5A is a top-down view of the exemplar semiconductor structure after formation of semiconductor nanowires. FIG. 5B is a vertical cross-sectional view of the exemplary semiconductor structure along the plane B-B' at the step corresponding to FIG. 5A. FIG. 5C is a vertical cross-sectional view of the exemplary semiconductor structure along the plane C-C' at the step corresponding to FIG. 5A. FIG. 5D is a vertical cross-sectional view of the exemplary semiconductor structure along the plane D-D' at the step corresponding to FIG. 5A.

DETAILED DESCRIPTION OF THE INVENTION

Figure 1A:
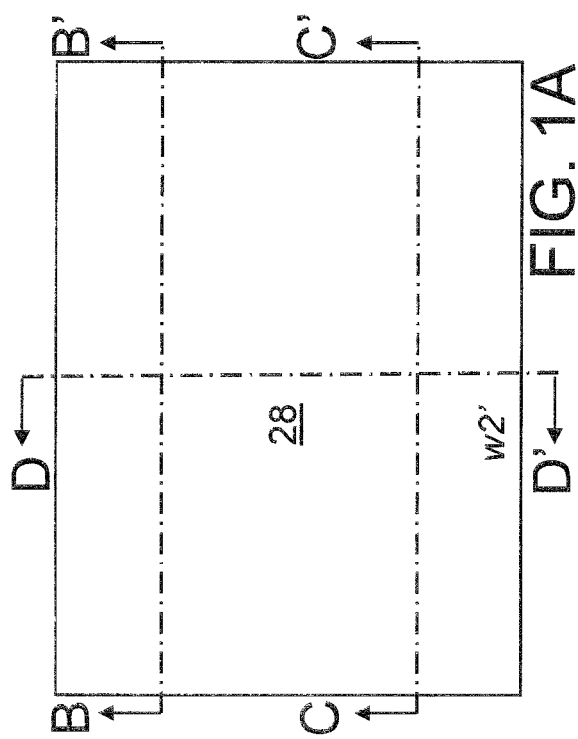
FIG. 1A is a top-down view of an exemplary semiconductor structure when provided as a semiconductor-on-insulator (SOI) substrate.
Figure 1D:
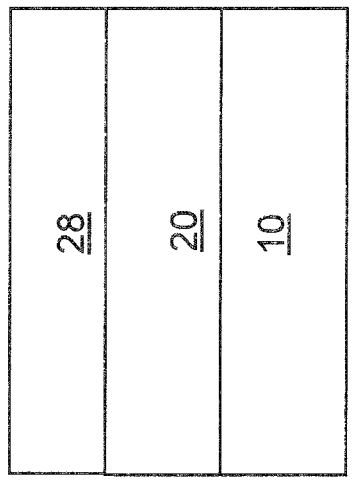
FIG. 1D is a vertical cross-sectional view of the exemplary semiconductor structure along the plane D-D' at the step corresponding to FIG. 1A.
Figure 1B:
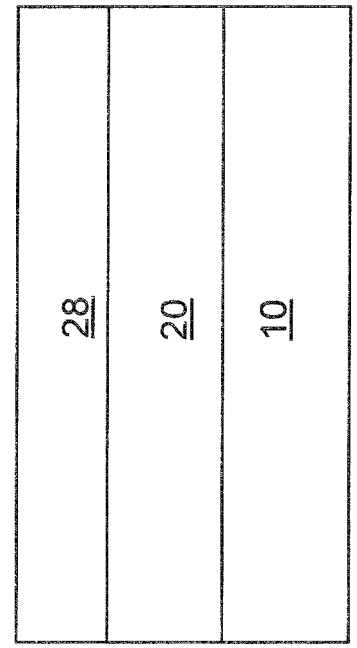
FIG. 1B is a vertical cross-sectional view of the exemplary semiconductor structure along the plane B-B' at the step corresponding to FIG. 1A.
Figure 1C:
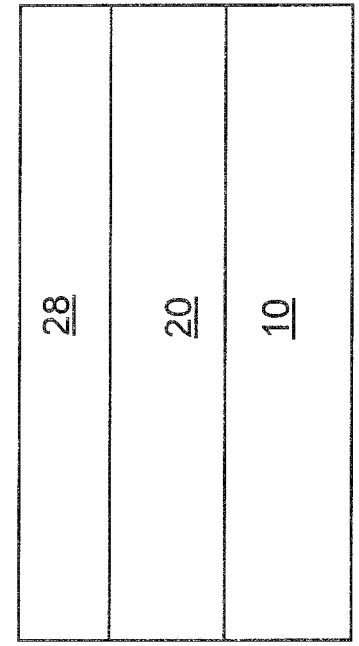
FIG. 1C is a vertical cross-sectional view of the exemplary semiconductor structure along the plane C-C' at the step corresponding to FIG. 1A.
Figure 3A:
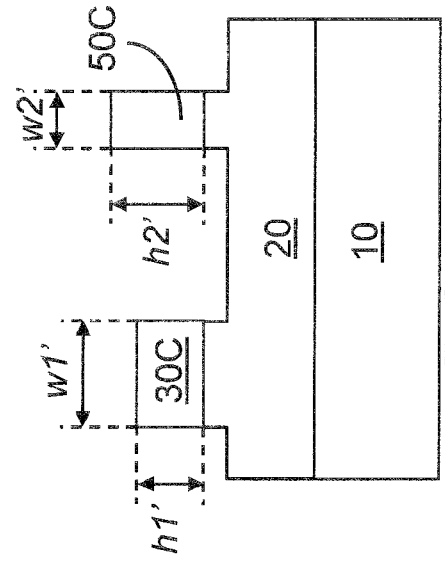
FIG. 3A is a top-down view of the exemplary semiconductor structure after patterning of semiconductor link portions and semiconductor pads.
Figure 3B:
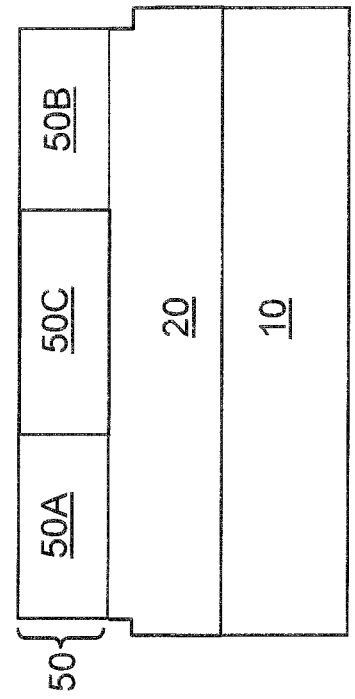
FIG. 3B is a vertical cross-sectional view of the exemplary semiconductor structure along the plane B-B' at the step corresponding to FIG. 3A.
Figure 3D:
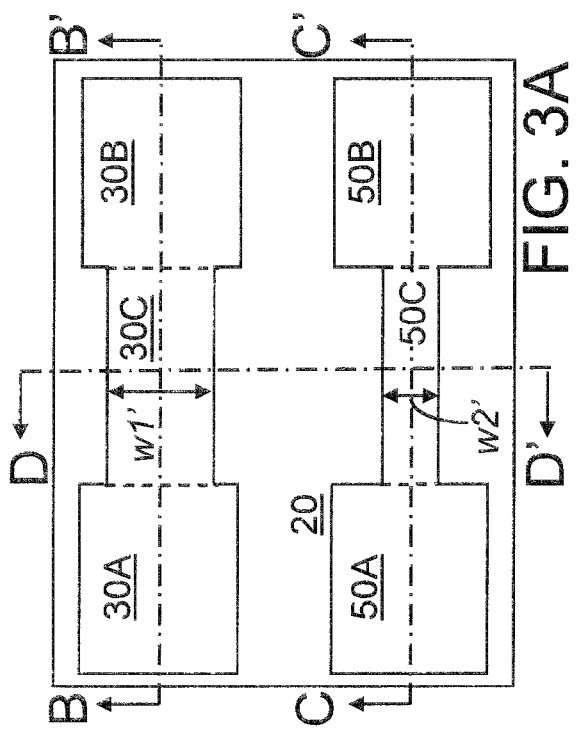
FIG. 3D is a vertical cross-sectional view of the exemplar semiconductor structure along the plane D-D' at the step corresponding to FIG. 3A.
Figure 3C:
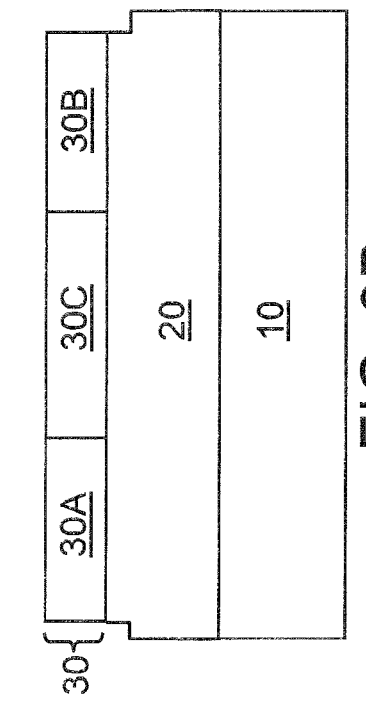
FIG. 3C is a vertical cross-sectional view of the exemplary semiconductor structure along the plane C-C' at the step corresponding to FIG. 3A.
Figure 4A:
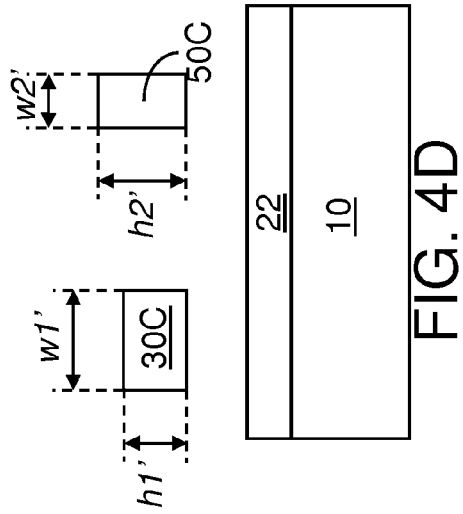
FIG. 4A is a top-down view of the exemplary semiconductor structure after formation of insulator pedestals.
Figure 4B:
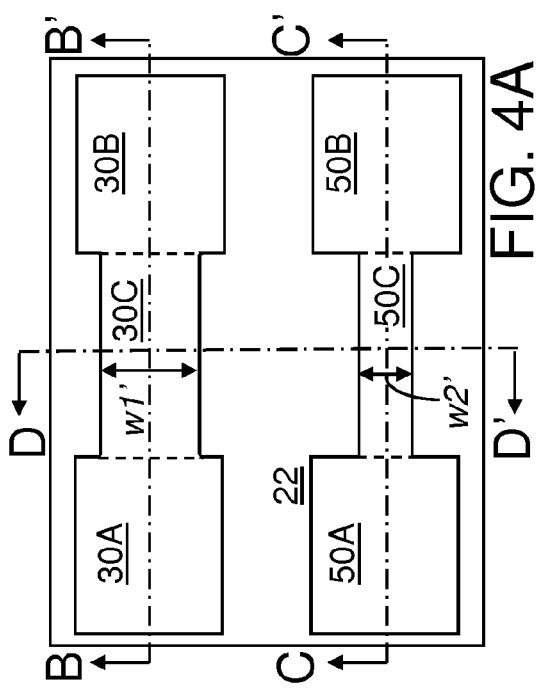
FIG. 4B is a vertical cross-sectional view of the exemplary semiconductor structure along the plane B-B' at the step corresponding to FIG. 4A.
Figure 4D:
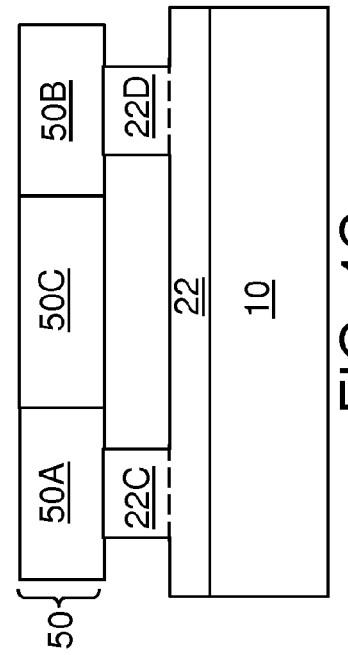
FIG. 4D is a vertical cross-sectional view of the exemplary semiconductor structure along the plane D-D' at the step corresponding to FIG. 4A.
Figure 4C:
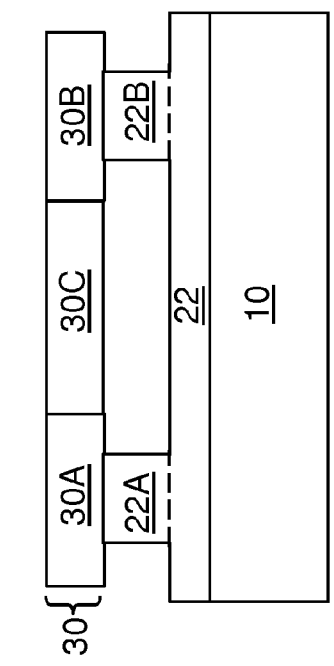
FIG. 4C is a vertical cross-sectional view of the exemplary semiconductor structure along the plane C-C' at the step corresponding to FIG. 4A.

As stated above, the present invention relates to nanowires for enhancing orientation and stress-dependent mobility effect and methods of manufacturing the same, which are now described in detail with accompanying figures. It is noted that like and corresponding elements are referred to by like reference numerals.

Referring to FIGS. 1A-1D, an exemplary semiconductor structure according to the present invention includes a semiconductor-on insulator (SOI) substrate which contains a handle substrate 10, a buried insulator layer 20, and a top semiconductor layer 28. The top semiconductor layer 28 comprises a semiconductor material, which may be selected from, but is not limited to silicon, germanium, silicon-germanium alloy, silicon carbon alloy, silicon-geranium-carbon alloy, gallium arsenide, indium arsenide, indium phosphide, III-V compound semiconductor materials, II-VI compound semiconductor materials, organic semiconductor materials, and other compound semiconductor materials. In one embodiment, the top semiconductor layer 28 may include a Si-containing semiconductor material such as single crystalline silicon or a single crystalline silicon-germanium alloy.

Preferably, the entirety of the semiconductor material within the top semiconductor layer 28 is single crystalline material, i.e., has an epitaxial atomic alignment throughout. In this case, the crystallographic orientation of the surface normal of the top surface of the top semiconductor layer 28 is herein referred to as a surface orientation of the top surface of the top semiconductor layer 28. Preferably, the surface orientation for the top surface of the top semiconductor layer 28 is one of the surface orientations at which either hole mobility or electron mobility is at maximum at least locally, and preferably globally. For example, the top semiconductor layer 28 may include single crystalline silicon and the top surface of the top semiconductor layer 28 may have a [001] surface orientation at which electron mobility of the top surface of the top semiconductor layer 28 becomes maximum or a [110] surface orientation at which hole mobility of the top surface of the top semiconductor layer 28 becomes maximum. The thickness of the top semiconductor layer 28 may be from 10 nm to 200 nm, although lesser and greater thicknesses are also contemplated herein.

The buried insulator layer 20 is an insulator layer including an insulator material, i.e., a dielectric material layer that includes a dielectric material. The dielectric material of the buried insulator layer 20 may be, for example, silicon oxide, silicon nitride, silicon oxynitride, quartz, a ceramic material, or a combination thereof. The thickness of the buried insulator layer 20 may be from 50 nm to 1,000 nm, although lesser and greater thicknesses are also contemplated herein. The handle substrate 10 may comprise a semiconductor material, an insulator material, or a conductive material. In some cases, the handle substrate 10 and the buried insulator layer 20 may comprise the same dielectric material and may be of unitary and integral construction.

Referring to FIGS. 2A-2D, two portions of the top semiconductor layer 28 are processed differently to form a first top semiconductor portion 29 having a first initial height h1' and a second top semiconductor portion 49 having a second initial height h2'. Different types of processing methods may be employed to form the first and second top semiconductor portions (30, 49) having different thicknesses. The second initial height h2' is greater than the first initial height h1'. The first initial height h1' may be from 10 nm to about 200 nm, and the second initial height h2' may be from 15 nm to about 300 nm, although lesser and greater heights are also contemplated herein.

In one embodiment, a pre-selected area of the top semiconductor layer 28 is masked with a hard mask layer, while the top surface of the top semiconductor layer 28 is exposed in the complementary area of the pre-selected area. This may be effected by deposition of a blanket layer comprising a hard mask material and lithographic patterning so that the hard mask material remains only in the pre-selected area to form the hard mask layer. Typically, the hard mask layer comprises a dielectric material such as silicon oxide, silicon nitride, or a combination thereof. A selective epitaxial growth of additional semiconductor material is performed so that the additional semiconductor material is added to the complementary area, while the thickness of the top semiconductor layer 28 does not change in the masked area that is covered with the hard mask layer. During the selective epitaxy, semiconductor material does not nucleate or grow directly on the surface of the hard mask layer. However, the semiconductor material grows epitaxially on the exposed portions of the top surface of the top semiconductor layer 28 in the complementary area during the selective epitaxy. Thus, the thickness of the semiconductor material in the complementary area increases. Typically, the epitaxially grown material is the same material as the semiconductor material of the top semiconductor layer 28. After the selective epitaxy, the hard mask layer is removed. The portion of the top semiconductor layer 28 in the masked area has the same thickness as the thickness of the top semiconductor layer 28 prior to the selective epitaxy, and is the first top semiconductor portion 29 having the first initial height h1'. The portion of the top semiconductor layer 28 in the complementary area and the epitaxially grown additional semiconductor material on that portion collectively constitute the second top semiconductor portion 49 having the second initial height h2', which is eater than the first initial height h1' by the thickness of the epitaxially grown semiconductor material added during the selective epitaxy step.

In another embodiment, a pre-selected area of the top semiconductor layer 28 is masked with an oxidation barrier layer, while the top surface of the top semiconductor layer 28 is exposed in the complementary area of the pre-selected area. This may be affected by deposition of a blanket layer comprising an oxygen barrier material and lithographic patterning so that the oxygen barrier material remains only in the pre-selected area to form the hard mask layer. Typically, the oxygen barrier layer comprises a dielectric material such as silicon nitride. A pad dielectric layer comprising another dielectric material such as silicon oxide may be employed to promote adhesion as needed. Oxidation of the exposed portions of the semiconductor material is performed so that the top portion of the top semiconductor layer 28 is converted into semiconductor oxide material in the complementary area, while the oxidation barrier layer prevents diffusion of oxygen into the top semiconductor layer 28 or conversion of the semiconductor material of the top semiconductor layer 28 into a semiconductor oxide material in the masked area, i.e., the pre-selected area, that is covered with the oxidation barrier layer. The semiconductor oxide material in the complementary area is removed by an etch that is selective to the semiconductor material of the top semiconductor layer 28. The oxidation barrier layer and the pad dielectric layer, if any, are removed selective to the semiconductor material of the top semiconductor layer 28. In the mask area, the thickness of the top semiconductor layer 28 does not change. The top semiconductor layer 28 in the masked area constitutes the second top semiconductor portion 49 having the second initial height h2', which is the same as the initial thickness of the top semiconductor layer 28 prior to oxidation. The top semiconductor layer 28 in the complementary area constitutes the first top semiconductor portion 29 having the first initial height h1', which is less than the initial thickness of the top semiconductor layer 28 prior to oxidation by the thickness of the semiconductor material that is oxidized during the oxidation step.

The first top semiconductor portion 29 and the second top semiconductor portion 49 are doped as needed. The first top semiconductor portion 29 may be doped with dopants of the first conductivity type and the second top semiconductor portion 49 may be doped with dopants of the second conductivity type which is the opposite of the first conductivity type. For example, the first conductivity type may be p-type and the second conductivity type may be n-type, or vice versa. Patterned ion implantation masks may be employed during ion implantation or plasma doping to insure that the first top semiconductor portion 29 and the second top semiconductor portion 49 are doped with appropriate doping. Typically, the dopant concentration in doped regions is in the range from $5.0 \times 10^{14}/cm^3$ to $3.0 \times 10^7/cm^3$, although lesser and greater dopant concentrations are also contemplated herein.

Preferably, the surface orientation of the top surface of the first top semiconductor portion 29 and the second conductivity type are selected such that the carrier mobility is at maximum for charge carriers of the second conductivity type for current flow in the plane of the top surface of the first top semiconductor portion 29. For example, if the semiconductor material of the first top semiconductor portion 29 is silicon and if the first conductivity type is p-type and the second conductivity type n-type, the surface orientation of the top surface of the first top semiconductor portion 29 is a <001> crystallographic orientation so that electron mobility is at maximum in the top surface of the first top semiconductor portion 29 having a {001} surface orientation. In another illustrative example, if the semiconductor material of the first top semiconductor portion 29 is silicon and if the first conductivity type is ntype and the second conductivity type p-type, the surface orientation of the top surface of the first top semiconductor portion 29 is a <110> crystallographic orientation so that electron mobility is at maximum in the top surface of the first top semiconductor portion 29 having a {110} surface orientation.

Referring to FIGS. 3A-3D, a first semiconductor structure 30 is patterned in the first top semiconductor portion 29 and a second semiconductor structure 50 is patterned in the second top semiconductor portion. The first semiconductor structure 30 and the second semiconductor structure 50 may be patterned, for example, by applying a photoresist (not shown) to the top surfaces of the first and second top semiconductor portions (29, 49), lithographically patterning the photoresist, and transferring the pattern in the photoresist into the first and second top semiconductor portions (29, 49) and an upper portion of the buried insulator layer 20. The exposed sidewalls of the first and second semiconductor structures (30, 50) are substantially vertically coincident with the sidewalls of the patterned portions of the buried insulator layer 20. The photoresist is subsequently removed, for example, by ashing.

The first semiconductor structure 30 has a first shape as seen in a top-down view, i.e., as seen in the direction perpendicular to the interface between the handle substrate 10 and the buried insulator layer 20. The first semiconductor structure 30 includes a first semiconductor link portion 30C, a first prototype semiconductor pad 30A, and a second prototype semiconductor pad 30B. The first semiconductor link portion 30C has a rectangular shape and a constant first initial width w1' in the top-down view. The first initial width w1' is a lithographic dimension, i.e., a dimension that may be printed with a single lithographic exposure. Thus, the first initial width w1' is greater than 40 nm, while it is contemplated that a lesser first initial width w1' may be formed as lithography tools improve in the future. The first link shape is laterally adjoined by a first pad shape and a second pad shape, which have wider widths than the first link shape. The lengthwise direction of the first link shape, which is horizontal and is perpendicular to the direction of the first initial width w1', is herein referred to as a first horizontal direction. The widthwise direction of the first link shape, which is the direction of the first initial width w1', is herein referred to as a second horizontal direction. In a non-limiting illustrative example, the surface orientation of the top surface of the first semiconductor structure is a [001] crystallographic orientation, the first horizontal direction may be a [T10] crystallographic orientation and the second horizontal direction may be a [110] crystallographic orientation.

The first prototype semiconductor pad 30A laterally abuts a first end in the lengthwise direction of the first semiconductor link portion 30C and the second prototype semiconductor pad 30B laterally abuts a second end in the lengthwise direction of the first semiconductor link portion 30C. The first prototype semiconductor pad 30A and the second prototype semiconductor pad 30B have widths, i.e., dimensions in the second horizontal direction, that are greater than the first initial width w1'.

The second semiconductor structure 50 has a second shape as seen in the top-down view. The second semiconductor structure 50 includes a second semiconductor link portion 50C, a third prototype semiconductor pad 50A, and a fourth prototype semiconductor pad 50B. The first semiconductor link portion 30C has a rectangular shaped and a constant second initial width w2' in a top-down view. The second initial width w2' is less than the first initial width w1'. Typically, the second initial width w1' is a critical dimension, i.e., lithographically printable minimum dimension, or a dimension close to the critical dimension. The second link shape is laterally adjoined by a third pad shape and a fourth pad shape, which have wider widths than the second link shape. The lengthwise direction of the second link shape, which is horizontal and is perpendicular to the direction of the second initial width w2', is herein referred to as a third horizontal direction. The widthwise direction of the second link shape, which is the direction of the second initial width w2', is herein referred to as a fourth horizontal direction.

In one embodiment, the first horizontal direction is the same as the third horizontal direction and the second horizontal direction is the same as the fourth horizontal direction. In another embodiment, the first horizontal direction is not the same as the third horizontal direction and the second horizontal direction is not the same as the fourth horizontal direction.

The third prototype semiconductor pad 50A laterally abuts a first end in the lengthwise direction of the second semiconductor link portion 50C and the fourth prototype semiconductor pad 50B laterally abuts a second end in the lengthwise direction of the second semiconductor link portion 50C. The third prototype semiconductor pad 50A and the fourth prototype semiconductor pad 50B have widths, i.e., dimensions in the fourth horizontal direction, that are greater than the second initial width w2'.

Preferably, the third horizontal direction is selected to include a vertical plane at which charge carrier mobility for the charge carriers of the first conductivity type is at a local maximum at least, and preferably at global maximum among all vertical planes in the single crystalline semiconductor material constituting the second semiconductor structure 50. For example, if the first conductivity type is p-type and the second conductivity type is n-type, the third horizontal direction may be selected to include a plane that maximizes the hole mobility.

In a non-limiting illustrative example, if the semiconductor material is single crystalline silicon and the top surface of the second semiconductor structure 50 has a (001) surface orientation, such a requirement may be satisfied by selecting a [T10] direction as the third horizontal direction so that the vertical plane including the [T10] direction and the [001] direction has a (110) surface orientation. The fourth horizontal direction, which is perpendicular to the [T10] direction and the [001] direction, is a [110] direction. In this case, the first horizontal direction may be the same as the third horizontal direction and the second horizontal direction may be the same as the fourth horizontal direction.

The first semiconductor link potion 30C has a first pair of sidewalls that are separated by the first initial width w1'. The second semiconductor link portion 50C has a second pair of sidewalls that are separated by a second initial width w2'. The height of the first semiconductor structure 30 is the first initial height h1' and the height of the second semiconductor structure 50 is the second initial height h2'.

Referring to FIGS. 4A-4D, a substantially isotropic etch is performed on the dielectric material of the buried insulator layer 20 selective to the semiconductor material of the first semiconductor structure 30 and the second semiconductor structure 30. The first semiconductor structure 30 and the second semiconductor structure 50 are employed as an etch mask for the substantially isotropic etch. The substantially isotropic etch may be a wet etch or a dry etch. Because the etch is substantially isotropic, the edges of the first semiconductor structure 30 and the second semiconductor structure 50 are undercut as the etch progresses. The etch proceeds at least until the portions of the buried insulator layer 20 located directly underneath the first semiconductor structure 30 and the second semiconductor structure 50 are removed so that the first semiconductor structure 30 and the second semiconductor structure 50 become suspended over the remaining portions of the buried insulator layer 20. In other words, the first semiconductor structure 30 and the second semiconductor structure 50 do not have direct physical contact with the remaining portions of the buried insulator layer 20, which is herein referred to as a insulator layer 22 after the etch because it is not buried underneath an overlying structure at this point.

The etch also removes the dielectric material of the buried insulator layer 20 from underneath the peripheral portions of the first prototype semiconductor pad 30A, the second prototype semiconductor pad 30B, the third prototype semiconductor pad 50A, and the fourth prototype semiconductor pad 50B. A first dielectric pedestal 22A comprising a remaining portion of the buried insulator layer 20 is formed directly underneath a center portion of the first prototype semiconductor pad 30A. Likewise, a second dielectric pedestal 22B is formed directly underneath a center portion of the second prototype semiconductor pad 30B, a third dielectric pedestal 22C is formed directly underneath a center portion of the third prototype semiconductor pad 50A, and a fourth dielectric pedestal 22D is formed directly underneath a center portion of the fourth prototype semiconductor pad SOB. As the dielectric material is etched from underneath peripheral portions of the first and second semiconductor structures (30, 50) employing the first and second semiconductor structures (30, 50) as an etch mask, the buried insulator layer 20, which is a dielectric material layer, is undercut beneath the first and second semiconductor link portions (30C, 50C).

The first and second semiconductor link portions (30C, 50C) are suspended over a remaining portion of the buried insulator layer 20, which is the insulator layer 22. The first through fourth dielectric pedestals (22A, 22B, 22C, 22D) are integrally formed with the insulator layer 22, and are portions of the insulator layer 22. The first and second semiconductor structures (30, 50) contact the insulator layer 22, which incorporates the first through fourth dielectric pedestals (22A, 22B, 22C, 22D), at bottom surfaces of the first prototype semiconductor pad 30A, the second prototype semiconductor pad 30B, the third prototype semiconductor pad 50A, and the fourth prototype semiconductor pad 50B.

Referring to FIGS. 5A-5C, the first and second semiconductor structures (30, 50) are thinned, i.e., dimensions of the first and second semiconductor structures (30, 50) are reduced, for example, by oxidation. Specifically, exposed peripheral portions of the first and second semiconductor structures (30, 50) including the first and second semiconductor links (30C, 50C) are converted into oxide material portions by oxidation. The semiconductor oxide material is subsequently removed by an isotropic etch such as a wet etch. For example, if the first and second semiconductor structures (30, 50) include silicon, the semiconductor oxide material may be silicon oxide, which may be removed by hydrofluoric acid (HF). Alternately, an isotropic wet etch or an isotropic dry etch may be employed to thin the first and second semiconductor structures (30, 50) by removing the exposed outer portions of the semiconductor material.

The remaining portions of the first semiconductor structure 30 is herein referred to as a first semiconductor nanowire structure 32, which includes a first semiconductor pad 32A, a second semiconductor pad 32B, and a first semiconductor nanowire 32C. The first semiconductor pad 32A and the second semiconductor pad 32B laterally abut the first semiconductor nanowire 32C. The remaining portions of the second semiconductor structure 50 is herein referred to as a second semiconductor nanowire structure 52, which includes a third semiconductor pad 52A, a fourth semiconductor pad 52B, and a second semiconductor nanowire 52C. The third semiconductor pad 52A and the fourth semiconductor pad 52B laterally abut the second semiconductor nanowire 52C.

The first semiconductor nanowire 32C has a rectangular vertical cross-sectional area in a plane perpendicular to the first horizontal direction. The width of the first semiconductor nanowire 32C, which is the dimension of the first semiconductor nanowire 32C in the second horizontal direction between the pair of first sidewalls as recessed by the thinning, is herein referred to as a first width w1. The first width w1 is less than the first initial width w1' because the semiconductor material is consumed during the thinning process. Preferably, the first width w1 may be a lithographic dimension, i.e., a dimension that is equal to or greater than the smallest dimension that may be printed with a single lithographic exposure on a photoresist, or may be a sublithographic dimension. Typically, the first width w1 is from 2 nm to 60 nm, although lesser and greater dimensions are also contemplated herein. Preferably, the first width w1 is from 4 nm to 40 nm.

The second semiconductor nanowire 52C has a rectangular vertical cross-sectional area in a plane perpendicular to the third horizontal direction. The width of the second semiconductor nanowire 52C, which is the dimension of the second semiconductor nanowire 52C in the fourth horizontal direction between the pair of second sidewalls as recessed by the thinning, is herein referred to as a second width w2. The second width w2 is less than the second initial width w2' because the semiconductor material is consumed during the thinning process. The second width w2 is a sublithographic dimension. Typically, the second width w2 is from 1 nm to 20 nm, although lesser and greater dimensions are also contemplated herein. Preferably, the second width w2 is from 2 to 10 nm. The second width w2 is less than the first width w1.

Each of the first semiconductor nanowire 32C and the second semiconductor nanowire 52C comprises a single crystalline semiconductor material. The first semiconductor nanowire 32 has a first pair of horizontal surfaces and a first pair of nanowire sidewalls. The first pair of horizontal surfaces is the top surface and the bottom surface of the first semiconductor nanowire 32C. The first pair of nanowire sidewalls is the sidewall surfaces of the first semiconductor nanowire 32C that are separated by the first width w1. The second semiconductor nanowire 52C has a second pair of horizontal surfaces and a second pair of nanowire sidewalls. The second pair of horizontal surfaces is the top surface and the bottom surface of the second semiconductor nanowire 52C. The second pair of nanowire sidewalls is the sidewall surfaces of the second semiconductor nanowire 52C that are separated by the second width w2. The first and second pairs of horizontal surfaces have a first surface orientation, which is the crystallographic orientation of the top surfaces of the first and second semiconductor nanowires (32C, 52C). In case the second and fourth horizontal directions are identical, the first and second pairs of nanowire sidewalls have the same surface orientation, which is herein referred to as a second surface orientation.

The thinning process consumes the semiconductor material of the first and second semiconductor structures (30, 50) from the top and bottom surfaces of the first and second semiconductor structures (30, 50). Thus, the height of the first semiconductor nanowire structure 32, which is herein referred to as a first height h1, is less than the first initial height h1' and the height of the second semiconductor nanowire structure 52, which is herein referred to as a second height h2, is less than the second initial height h2'. If the top surfaces of the first semiconductor nanowire structure 32 and the second semiconductor nanowire structures 52 have the same crystallographic orientation, the thinning rate of the top and bottom surfaces of the first and second semiconductor structures (30, 50) are the same and the difference between the first initial height h1' and the first height h1 is the same as the difference between the second initial height h2' and the second height h2, i.e., (h1'−h1)=(h2'−h2). If the top surfaces of the first semiconductor nanowire structure 32 and the second semiconductor nanowire structures 52 have different crystallographic orientations, the thinning rate of the top and bottom surfaces of the first and second semiconductor structures (30, 50) may be different and the difference between the first initial height h1' and the first height h1 may be different from the difference between the second initial height h2' and the second height h2. Each of the first semiconductor nanowire structure 32 and the second semiconductor nanowire structures 52 have a substantially rectangular vertical cross-sectional area, i.e., the vertical cross-sectional areas perpendicular to lengthwise directions of the first semiconductor nanowire structure 32 and the second semiconductor nanowire structures 52 are substantially rectangular.

In one embodiment, the single crystalline semiconductor material of the first and second semiconductor nanowires (32, 52) has a greater electron mobility in the first surface orientation than in the second surface orientation, and has a greater hole mobility in the second surface orientation than in the first surface orientation. For example, the single crystalline semiconductor material may be silicon, the first surface orientation may be a {001} surface orientation, and the second surface orientation may be a {110} surface orientation.

In another embodiment, the single crystalline semiconductor material of the first and second semiconductor nanowires (32, 52) has a greater hole mobility in the first surface orientation than in the second surface orientation, and has a greater electron mobility in the second surface orientation than in the first surface orientation. For example, the single crystalline semiconductor material may be silicon, the first surface orientation may be a {110} surface orientation, and the second surface orientation may be a {001} surface orientation.

Referring to FIGS. 6A-6D, a first gate dielectric 36 is formed on the exposed surfaces of the first semiconductor nanowire structure (32A, 32B, 32C) and a second gate dielectric 56 is formed on the exposed surfaces of the second semiconductor nanowire structure (52A, 52B, 52C).

In one case, the first gate dielectric 36 and the second gate dielectric 56 comprise a dielectric material formed by thermal conversion of outer portions of the first semiconductor nanowire structure (32A, 32B, 32C) and the second semiconductor nanowire structure (52A, 52B, 52C)₃, such as silicon oxide or silicon nitride. Thermal oxidation, thermal nitridation, plasma oxidation, plasma nitridation, or a combination thereof may be employed to form the first gate dielectric 36 and the second gate dielectric 56. In this case, the first gate dielectric 36 and the second gate dielectric 56 are formed only on the surfaces of the first semiconductor nanowire structure (32A, 32B, 32C) and the second semiconductor nanowire structure (52A, 52B, 52C). The thickness of the first gate dielectric 36 and the second gate dielectric 56 may be from about 0.8 nm to about 10 nm, and is typically from about 1.1 nm to about 6 nm.

In another case, the first gate dielectric 36 and the second gate dielectric 56 may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited. In this case, the first gate dielectric 36 and the second gate dielectric 56 may be formed as a single contiguous gate dielectric layer covering the entirety of the top surfaces and sidewall surfaces of the first semiconductor nanowire structure (32A, 32B, 32C) and the second semiconductor nanowire structure (52A, 52B, 52C) and all exposed surfaces of the insulator layer 22 including the first through fourth dielectric pedestals (22A, 22B, 22C, 22D). In this case, the thickness of the first gate dielectric 36 and the second gate dielectric 56 may be from about 1 nm to about 6 nm, and may have an effective oxide thickness on the order of or less than 1 nm.

Figure 6A:
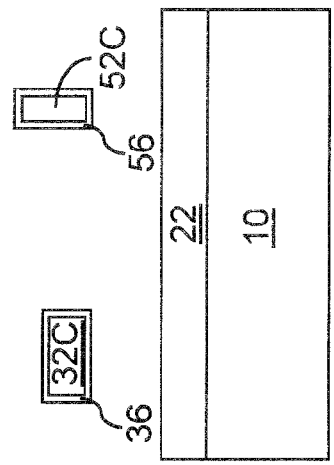
FIG. 6A is a top-down view of the exemplary semiconductor structure after formation of gate dielectrics.
Figure 6B:
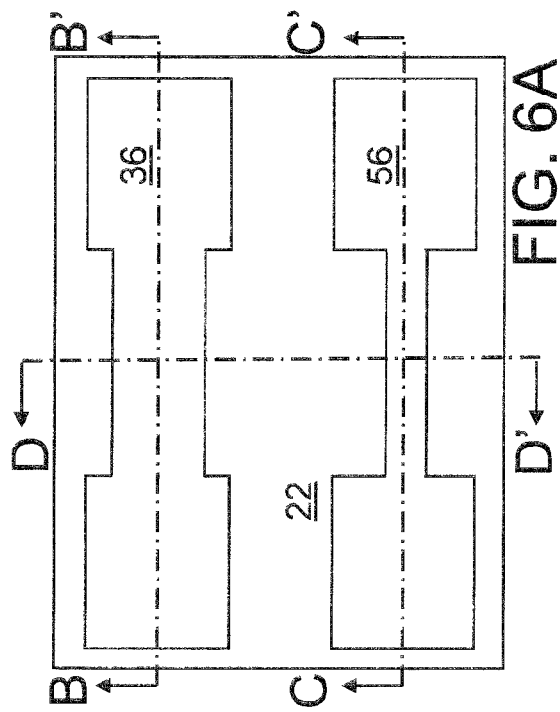
FIG. 6B is a vertical cross-sectional view of the exemplary semiconductor structure along the plane B-B' at the step corresponding to FIG. 6A.
Figure 6D:
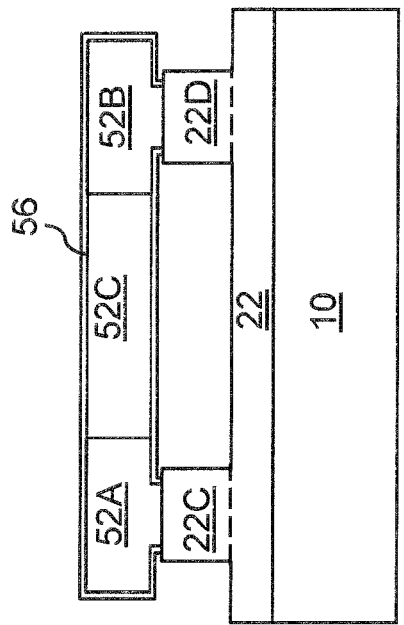
FIG. 6D is a vertical cross-sectional view of the exemplary semiconductor structure along the plane D-D' at the step corresponding to FIG. 6A.
Figure 6C:
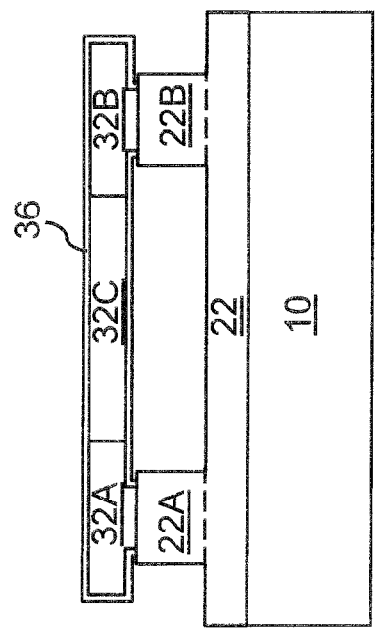
FIG. 6C is a vertical cross-sectional view of the exemplary semiconductor structure along the plane C-C' at the step corresponding to FIG. 6A.
Figure 7A:
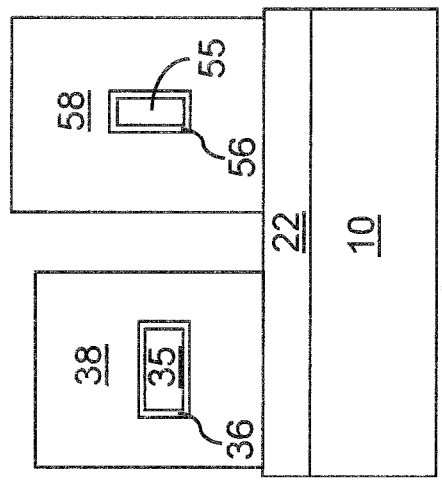
FIG. 7A is a top-down view of the exemplary semiconductor structure after formation of gate electrodes.
Figure 7D:
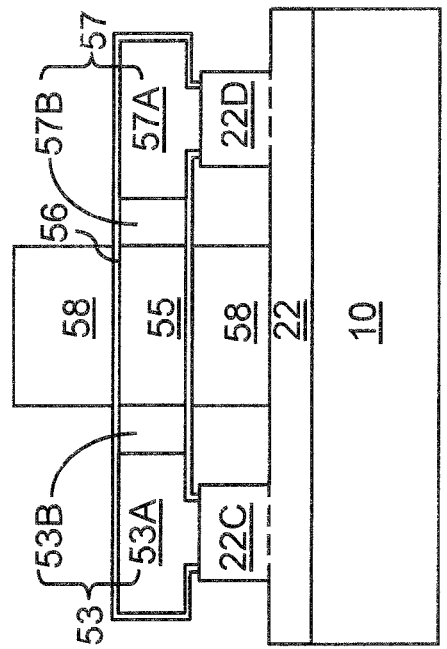
FIG. 7D is a vertical cross-sectional view of the exemplary semiconductor structure along the plane D-D' at the step corresponding to FIG. 7A.
Figure 7B:
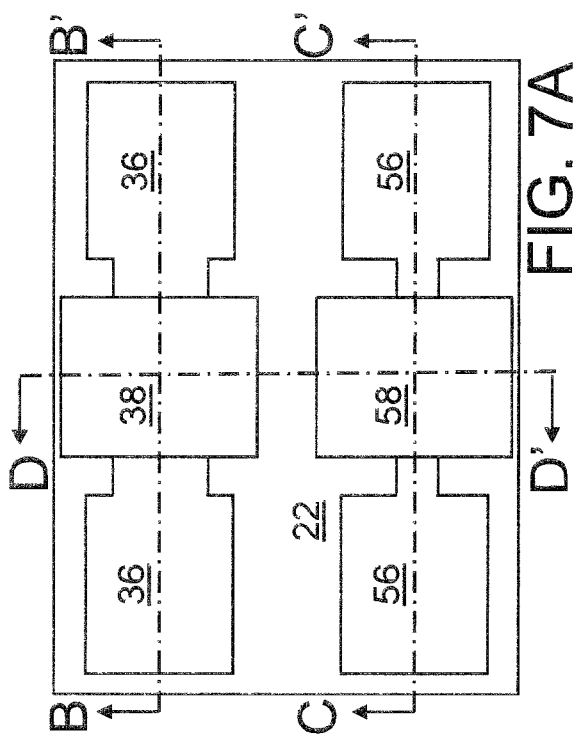
FIG. 7B is a vertical cross-sectional view of the exemplary semiconductor structure along the plane B-B' at the step corresponding to FIG. 7A.
Figure 7C:
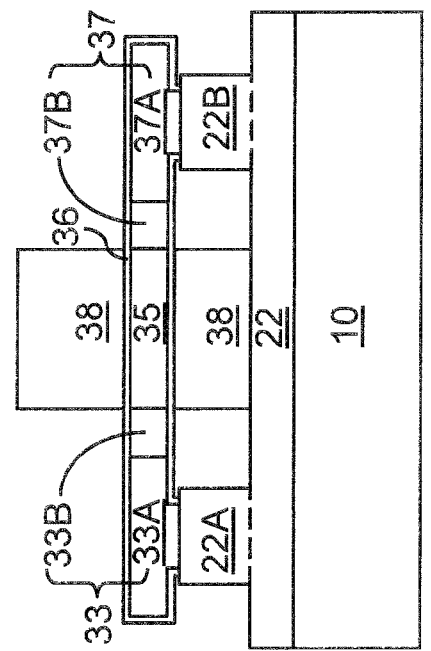
FIG. 7C is a vertical cross-sectional view of the exemplary semiconductor structure along the plane C-C' at the step corresponding to FIG. 7A.
Figure 8A:
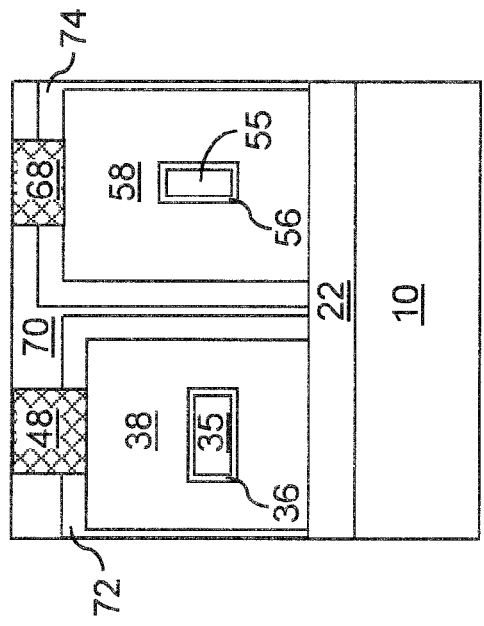
FIG. 8A is a top-down view of the exemplary semiconductor structure after formation of a middle-of-line (MOL) dielectric layer and contact vias.
Figure 8D:
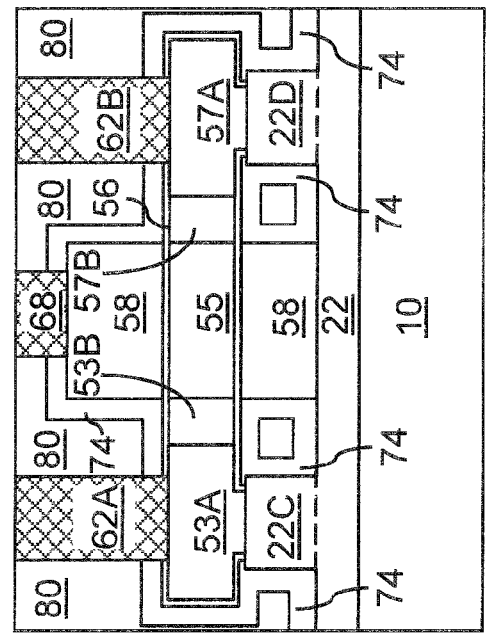
FIG. 8D is a vertical cross-sectional view of the exemplary semiconductor structure along the plane D-D' at the step corresponding to FIG. 8A.
Figure 8B:
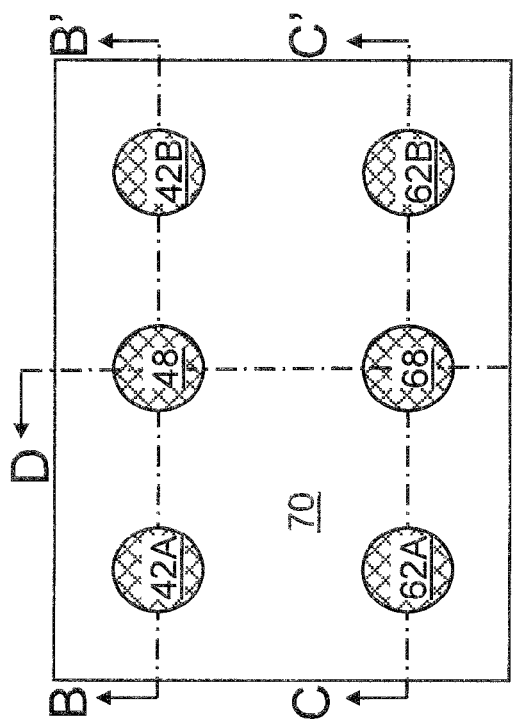
FIG. 8B is a vertical cross-sectional view of the exemplary semiconductor structure along the plane B-B' at the step corresponding to FIG. 8A.
Figure 8C:
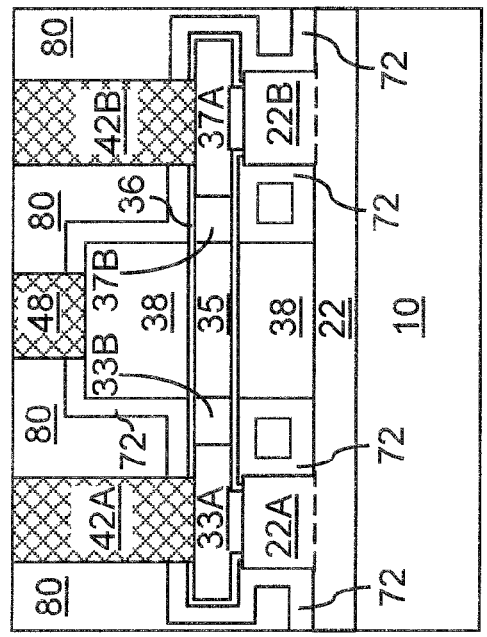
FIG. 8C is a vertical cross-sectional view of the exemplary semiconductor structure along the plane C-C' at the step corresponding to FIG. 8A.

Referring to FIGS. 7A-7C, a first gate electrode 38 is formed on and around a middle portion of the first semiconductor nanowire 32C (See FIG. 6B) and a second gate electrode 58 is formed on and around a middle portion of the second semiconductor nanowire (See FIG. 6C). The first and second gate electrodes (38, 58) may comprise the same material or a different material, and may be formed simultaneously by a single deposition step and a single lithographic patterning step, or may be formed employing multiple deposition steps and at least one lithographic patterning steps.

The first gate electrode 38 and the second gate electrode 58 comprises a conductive material such as a doped semiconductor material, a metal, a metallic alloy, a conductive compound of at least one metal, or combinations thereof. Preferably, the thickness of the deposited gate electrode material exceeds half the distance between the first and second semiconductor nanowires (32C, 52C; See FIGS. 6B and 6C) and the insulator layer 22 so that each of the first and the second gate electrodes (38, 58) contains only one hole within which one of the first and the second semiconductor nanowires (32C, 52C) is located.

In one embodiment, at least one of the first and the second gate electrodes (38, 58) may comprise an amorphous or polycrystalline semiconductor material such as polysilicon, amorphous silicon, a silicon-germanium alloy, a silicon-carbon alloy, a silicon-germanium-carbon alloy, or a combination thereof. The first and the second gate electrodes (38, 58) may be in-situ doped, or may be doped by a subsequent ion implantation of dopant ions.

Alternately or additionally, at least one of the first and the second gate electrodes (38, 58) may comprise a metal gate material, which comprises a metallic conductive material. For example, the at least one of the first and the second gate electrodes (38, 58) may comprise a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and comprising a conductive refractory metal nitride. In case the first gate dielectric 36 and the second gate dielectric 56 comprise a high-k gate dielectric material, the metal gate material may be formed directly on the first gate dielectric 36 and the second gate dielectric 56. The composition of the metal gate material may be selected to optimize threshold voltages of semiconductor devices to be subsequently formed in the first semiconductor nanowire structure (32A, 32B, 32C) and the second semiconductor nanowire structure (52A, 52B, 52C). Each of the at least one of the first and the second gate electrodes (38, 58) may include both a metal gate material and a semiconductor material.

Optionally, dielectric spacers (not shown) may be formed on the sidewalls of the first and second gate electrodes (38, 58) as needed, for example, to control the overlap between the first and second gate electrodes (38, 58) and source and drain regions of semiconductor nanowire transistors to be formed.

Dopants of the second conductivity type are implanted into portions of the first semiconductor nanowire structure (32A, 32B, 32C; See FIG. 6B) employing the first gate electrode 38 as an ion implantation mask. The second semiconductor nanowire structure (52A, 52B, 52C; See FIG. 6C) and the second gate electrode 58 may be covered with a block mask during the implantation of the dopants of the second conductivity type. The first semiconductor pad 32A and the second semiconductor pad 32B are doped with dopants of the second conductivity type, which are herein referred to as a first pad source portion 33A and a first pad drain portion 37A. The first pad source portion 33A is the first semiconductor pad 32A and the first pad drain portion 37A is the second semiconductor pad 32B. One end of the first semiconductor nanowire 32C (See FIG. 6B) abutting the first pad source portion 33A is also doped with dopants of the second conductivity type and is herein referred to as a first nanowire source portion 33B. The first pad source portion 33A and the first nanowire source portion 33B have a doping of the second conductivity type and are collectively called a first source region 33. The other end of the first semiconductor nanowire 32C (See FIG. 6B) abutting the first pad drain portion 37A is also doped with dopants of the second conductivity type and is herein referred to as a first nanowire drain portion 37B. The first pad drain portion 37A and the first nanowire drain portion 37B have a doping of the second conductivity type and are collectively called a first drain region 37. The middle portion of the first semiconductor nanowire 32C (See FIG. 6B3) that is not implanted with dopants of the second conductivity type has a doping of the first conductivity type, and is herein referred to as a first channel region 35. The first channel region 35 laterally abuts the first source region 33 and the first drain region 37. The first channel region 35, the first source region 33, the first drain region 37, the first gate dielectric 36, and the first gate electrode 38 collectively constitute a first semiconductor nanowire transistor that controls the flow of current through the first semiconductor nanowire (35, 33B, 37B).

Dopants of the first conductivity type are implanted into portions of the second semiconductor nanowire structure (52A, 52B, 52C; See FIG. 6C) employing the second gate electrode 58 as an ion implantation mask. The first semiconductor nanowire structure (32A, 32B, 32C; See FIG. 6B) and the first gate electrode 38 may be covered with a block mask during the implantation of the first conductivity type. The third semiconductor pad 52A and the fourth semiconductor pad 52B are doped with dopants of the first conductivity type, which are herein referred to as a second pad source portion 53A and a second pad drain portion 57A. One end of the second semiconductor nanowire 52C (See FIG. 6C) abutting the second pad source portion 53A is also doped with dopants of the first conductivity type and is herein referred to as a second nanowire source portion 53B. The second pad source portion 53A and the second nanowire source portion 53B have a doping of the first conductivity type and are collectively called a second source region 53. The other end of the second semiconductor nanowire 52C (See FIG. 6C) abutting the second pad drain portion 57A is also doped with dopants of the first conductivity type and is herein referred to as a second nanowire drain portion 57B. The second pad drain portion 57A and the second nanowire drain portion 57B have a doping of the first conductivity type and are collectively called a second drain region 57. The middle portion of the second semiconductor nanowire 52C (See FIG. 6C) that is not implanted with dopants of the first conductivity type has a doping of the second conductivity type, and is herein referred to as a second channel region 55. The second channel region 55 laterally abuts the second source region 53 and the second drain region 57. The second channel region 55, the second source region 53, the second drain region 57, the second gate dielectric 56, and the second gate electrode 58 collectively constitute a second semiconductor nanowire transistor that controls the flow of current through the second semiconductor nanowire (55, 53B, 57B).

Referring to FIGS. 8A-8D, a first stress-generating material layer 72 is formed around the first semiconductor nanowire structure (33A, 33B, 35, 37A, 37B) and a second stress-generating material layer 74 is formed around the second semiconductor nanowire structure (53A, 53B, 55, 57A, 57B). The first stress-generating material layer 72 and the second stress-generating material layer 74 may be formed, for example, by chemical vapor deposition (CVD), which may be conformal or non-conformal. Typically, the first stress-generating material layer 72 and the second stress-generating material layer 74 include a dielectric material such as silicon nitride.

The first stress-generating material layer 72 surrounds the first semiconductor nanowire (35, 33B, 37B) and applies a first longitudinal stress to the first semiconductor nanowire (35, 33B, 37B) along a lengthwise direction, which is the first horizontal direction. The second stress-generating material layer 74 surrounds the second semiconductor nanowire (55, 53B, 57B) and applies a second longitudinal stress to the second semiconductor nanowire (55, 53B, 57B) along a lengthwise direction, which is the third horizontal direction. One of the first longitudinal stress and the second longitudinal stress is a compressive stress and the other of the first longitudinal stress and the second longitudinal stress is a tensile stress.

The first semiconductor nanowire (35, 33B, 37B) and the second semiconductor nanowire (55, 53B, 57B) have different width-to-height ratio. The first semiconductor nanowire (35, 33B, 37B) has a first width-to-height ratio, which is the ratio of the first width w1 to the first height h1. The second semiconductor nanowire (55, 53B, 57B) has a second width-to-height ratio, which is the ratio of the second width w2 to the second height h2. The first width-to-height ratio is greater than the second width-to-height ratio.

In case the first semiconductor nanowire (35, 33B, 37B) and the second semiconductor nanowire (55, 53B, 57B) have the same set of crystallographic orientations and the lengthwise directions of the first semiconductor nanowire (35, 33B, 37B) and the second semiconductor nanowire (55, 53B, 57B) are the same, the first pair of horizontal surfaces of the first semiconductor nanowire (35, 33B, 37B) and the second pair of horizontal surfaces of the second semiconductor nanowire (55, 53B, 57B) have the same surface orientation, i.e., the first surface orientation, which is the crystallographic orientation of the top surfaces of the first and second semiconductor nanowires (32C, 52C). In this case, the second and fourth horizontal directions are identical, the first pair of nanowire sidewalls of the first semiconductor nanowire (35, 33B, 37B) and the second pair of nanowire sidewalls of the second semiconductor nanowire (55, 53B, 57B) have the same surface orientation, i.e., the second surface orientation. The single crystalline semiconductor material of the first semiconductor nanowire (35, 33B, 37B) has a greater charge carrier mobility for charge carriers of the second conductivity type in the first surface orientation than in the second surface orientation and has a greater charge carrier mobility for charge carriers of the first conductivity type in the second surface orientation than in the first surface orientation. In contrast, the single crystalline semiconductor material of the second semiconductor nanowire (55, 53B, 57B) has a greater charge carrier mobility for charge carriers of the first conductivity type in the first surface orientation than in the second surface orientation and has a greater charge carrier mobility for charge carriers of the second conductivity type in the second surface orientation than in the first surface orientation.

The type of the first longitudinal stress and the type of second longitudinal stress are selected such that the charge carrier mobility for charge carriers of the second conductivity type in the first pair of horizontal surfaces is enhanced by the first longitudinal stress and the charge carrier mobility for charge carriers of the first conductivity type in the second pair of nanowire sidewalls is enhanced by the second longitudinal stress.

The on-current of the semiconductor nanowire transistor formed in the first semiconductor nanowire structure (35, 33A, 33B, 37A, 37B) is enhanced by the combination of the first width-to-height ratio, i.e., w1/h1, which is preferably greater than 1.0, and the selection of the crystallographic orientations so that the first surface orientation provides maximum charge carrier mobility for charge carriers of the second conductivity type, and the selection of the first longitudinal stress to enhance charge carrier mobility for charge carriers of the second conductivity type in the first pair of horizontal surfaces. The greater the first width-to-height ratio, the greater fraction of the total current through the first semiconductor nanowire (35, 33B, 37B) passes in the plane of the first pair of horizontal surfaces underneath the top and bottom surfaces of the first semiconductor nanowire (35, 33B, 37B) than in the plane of the first pair of nanowire sidewalls underneath the sidewalls of the first semiconductor nanowire (35, 33B, 37B).

The on-current of the semiconductor nanowire transistor formed in the second semiconductor nanowire structure (55, 53A, 53B, 57A) 57B) is enhanced by the combination of the second width-to-height ratio, i.e., w2/h2, which is preferably lesser than 1.0, and the selection of the crystallographic orientations so that the second surface orientation provides maximum charge carrier mobility for charge carriers of the first conductivity type, and the selection of the second longitudinal stress to enhance charge carrier mobility for charge carriers of the first conductivity type in the second pair of nanowire sidewalls. The smaller the second width-to-height ratio, the greater fraction of the total current through the second semiconductor nanowire (55, 53B, 57B) passes in the plane of the second pair of nanowire sidewalls underneath the sidewalls of the second semiconductor nanowire (55, 53B, 57B) than in the plane of the second pair of horizontal surfaces underneath the top and bottom surfaces of the second semiconductor nanowire (55, 53B, 57B).

In one embodiment, the first conductivity type is p-type and the second conductivity type is n-type. The first semiconductor nanowire transistor including the first semiconductor nanowire (35, 33B, 37B) is an n-type semiconductor nanowire transistor in which the charge carriers are electrons, and the second semiconductor nanowire transistor including the second semiconductor nanowire (55, 53B, 57B) is a p-type semiconductor nanowire transistor in which the charge carriers are holes. The single crystalline semiconductor material has a greater electron mobility in the first pair of horizontal surfaces than in the first pair of nanowire sidewalls and has a greater hole mobility in the second pair of nanowire sidewalls than in the second pair of horizontal surfaces. If the single crystalline semiconductor material is silicon, the first longitudinal stress may be a tensile stress and the second longitudinal stress may be a compressive stress. The tensile longitudinal stress enhances electron mobility and the compressive longitudinal stress enhances hole mobility in single crystalline silicon in many cases. For example, the first surface orientation may be a {100} orientation and the second surface orientation may be a {110} orientation to enhance the electron mobility and the hole mobility in the first semiconductor nanowire (35, 33B, 37B) and the second semiconductor nanowire (55, 53B, 57B), respectively.

In another embodiment, the first conductivity type is ntype and the second conductivity type is p-type. The first semiconductor nanowire transistor including the first semiconductor nanowire (35, 33B, 37B) is a p-type semiconductor nanowire transistor in which the charge carriers are holes, and the second semiconductor nanowire transistor including the second semiconductor nanowire (55, 53B, 57B) is an n-type semiconductor nanowire transistor in which the charge carriers are electrons. The single crystalline semiconductor material has a greater hole mobility in the first pair of horizontal surfaces than in the first pair of nanowire sidewalls and has a greater electron mobility in the second pair of nanowire sidewalls than in the second pair of horizontal surfaces. If the single crystalline semiconductor material is silicon, the first longitudinal stress may be a compressive stress and the second longitudinal stress may be a tensile stress. For example, the first surface orientation may be a {110} orientation and the second surface orientation may be a {001} orientation to enhance the hole mobility and the electron mobility in the first semiconductor nanowire (35, 33B, 37B) and the second semiconductor nanowire (55, 53B, 57B), respectively.

A middle-of-line (MOL) dielectric material layer 80 is formed over the first and second semiconductor nanowire transistors. The MOL dielectric material layer 80 may include a mobile ion diffusion barrier layer (not shown) which comprises a material that blocks the diffusion of mobile ions such as Na+ and K+. Typical material employed for the mobile ion diffusion barrier layer includes silicon nitride. The MOL dielectric material layer 80 may include for example, a CVD oxide, spin-on low dielectric constant material having a dielectric constant less than 2.8, an organosilicate glass or a CVD low dielectric material having a dielectric constant less than 2.8, or any other dielectric material that may be employed for a back-end-of-line (BEOL) dielectric layer in metal interconnect structures. For example. The CVD oxide may be an undoped silicate glass (USC), borosilicate glass (BSG), phosphosilicate glass (PSG), fluorosilicate glass (FSG), borophosphosilicate glass (BPSG), or a combination thereof. The MOL dielectric layer 80 fills the spaces between the insulator layer 22 and the first and second semiconductor nanowire (35, 33B, 37B, 55, 53B, 57B).

Various contact via holes are formed in the MOL dielectric layer 80 and filled with a conductive material to from various contact vias. Specifically, a first source-side contact via 42A is formed directly on the first pad source portion 33A, a first drain-side contact via 42B is formed directly on the first pad drain portion 37A, a first gate-side contact via 48 is formed directly on the first gate electrode 38. Likewise, a second source-side contact via 62A is formed directly on the second pad source portion 53A, a second drain-side contact via 62B is formed directly on the second pad drain portion 57A, a second gate-side contact via 68 is formed directly on the second gate electrode 58. The top surfaces of the MOL dielectric layer 80, the first source-side contact via 42A, the first drain-side contact via 42B, the first gate-side contact via 48, the second source-side contact via 62A, the second drain-side contact via 62B, and the second gate-side contact via 68 may be substantially coplanar after planarization of the MOL dielectric layer 80 and removal of the excess conductive material. Additional metal interconnect structures (not shown) including a first level metal wiring (not shown) may be formed above the MOL dielectric layer 80.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:
1. A semiconductor structure comprising:
a first semiconductor nanowire having a first substantially rectangular cross-sectional area, and having a first height between a first bottom surface and a first top surface thereof, and located on a substrate;
a second semiconductor nanowire having a second substantially rectangular cross-sectional area, and having a second height between a second bottom surface and a second top surface thereof, and located on said substrate, wherein said second bottom surface is coplanar with said first bottom surface, and said second height is greater than said first height;
a first semiconductor pad adjoining a first end of said first semiconductor nanowire and having a greater width than said first semiconductor nanowire and not extending above a plane of said first top surface;

a second semiconductor pad adjoining a second end of said first semiconductor nanowire and having a greater width than said first semiconductor nanowire;
a third semiconductor pad adjoining a first end of said second semiconductor nanowire and having a greater width than said second semiconductor nanowire and not extending above a plane of said second top surface; and
a fourth semiconductor pad adjoining a second end of said second semiconductor nanowire and having a greater width than said second semiconductor nanowire.

2. The semiconductor structure of claim 1, further comprising:
a first gate dielectric located on and surrounding said first semiconductor nanowire;
a first gate electrode located on and surrounding said first gate dielectric;
a second gate dielectric located on and surrounding said second semiconductor nanowire; and
a second gate electrode located on and surrounding said second gate dielectric.

3. The semiconductor structure of claim 2, further comprising:
a first channel region having a doping of a first conductivity type and located in a middle portion of said first semiconductor nanowire; and
a second channel region having a doping of a second conductivity type and located in a middle portion of said second semiconductor nanowire, wherein said second conductivity type is the opposite of said first conductivity type.

4. The semiconductor structure of claim 3, further comprising:
a first source region including at least a first end portion of said first semiconductor nanowire and having of a doping of said second conductivity type;
a first drain region including at least a second end portion of said first semiconductor nanowire and having a doping of said second conductivity type;
a second source region including at least a first end portion of said second semiconductor nanowire and having a doping of said first conductivity type; and
a second drain region including at least a second end portion of said second semiconductor nanowire and having a doping of said second conductivity type.

5. The semiconductor structure of claim 4, wherein said first source region includes a first semiconductor pad adjoining said first end portion of said first semiconductor nanowire, wherein said first drain region includes a second semiconductor pad adjoining said second end portion of said first semiconductor nanowire, wherein said second source region includes a third semiconductor pad adjoining said first end portion of said second semiconductor nanowire, and wherein said second drain region includes a fourth semiconductor pad adjoining said second end portion of said second semiconductor nanowire.

6. The semiconductor structure of claim 5, further comprising an insulator layer located in said substrate and underlying said first and second semiconductor nanowires and including a first insulator pedestal, a second insulator pedestal, a third insulator pedestal, and a fourth insulator pedestal, wherein said first insulator pedestal adjoins said first semiconductor pad, wherein said second insulator pedestal adjoins said second semiconductor pad, wherein said third insulator pedestal adjoins said third semiconductor pad, and wherein said fourth insulator pedestal adjoins said fourth semiconductor pad.

7. A semiconductor structure comprising:
a first semiconductor nanowire having a first substantially rectangular cross-sectional area and a first height and located on a substrate;
a second semiconductor nanowire having a second substantially rectangular cross-sectional area and a second height and located on said substrate, wherein said second height is greater than said first height;
a first stress-generating material layer surrounding said first semiconductor nanowire and applying a first longitudinal stress to said first semiconductor nanowire along a lengthwise direction; and
a second stress-generating material layer surrounding said second semiconductor nanowire and applying a second longitudinal stress to said second semiconductor nanowire along a lengthwise direction, wherein one of said first longitudinal stress and said second longitudinal stress is a compressive stress and the other of said first longitudinal stress and said second longitudinal stress is a tensile stress.

8. The semiconductor structure of claim 7, wherein each of said first semiconductor nanowire and said second semiconductor nanowire comprises a single crystalline semiconductor material.

9. The semiconductor structure of claim 8, wherein said first semiconductor nanowire has a first pair of horizontal surfaces and a first pair of nanowire sidewalls, wherein said second semiconductor nanowire has a second pair of horizontal surfaces and a second pair of nanowire sidewalls, wherein said first and second pairs of horizontal surfaces have a first surface orientation, and wherein said first and second pairs of nanowire sidewalls have a second surface orientation.

10. The semiconductor structure of claim 9, wherein said single crystalline semiconductor material has a greater electron mobility in said first pair of horizontal surfaces than in said first pair of nanowire sidewalls and has a greater hole mobility in said second pair of nanowire sidewalls than in said second pair of horizontal surfaces.

11. The semiconductor structure of claim 10, wherein said first longitudinal stress is a tensile stress and said second longitudinal stress is a compressive stress.

12. The semiconductor structure of claim 10, wherein said single crystalline semiconductor material comprises silicon, and wherein said first surface orientation is a {001} orientation and said second surface orientation is a {110} orientation.

13. The semiconductor structure of claim 9, wherein said single crystalline semiconductor material has a greater hole mobility in said first pair of horizontal surfaces than in said first pair of nanowire sidewalls and has a greater electron mobility in said second pair of nanowire sidewalls than in said second pair of horizontal surfaces.

14. The semiconductor structure of claim 13, wherein said first longitudinal stress is a compressive stress and said second longitudinal stress is a tensile stress.

15. The semiconductor structure of claim 13, wherein said single crystalline semiconductor material comprises silicon, and wherein said first surface orientation is a {110} orientation and said second surface orientation is a {001} orientation.

16. The semiconductor structure of claim 9, wherein said first pair of nanowire sidewalls is parallel to said second pair of nanowire sidewalls, and wherein said second surface orientation is a vertical plane at which one of hole mobility and electron mobility is at maximum among all vertical planes for said single crystalline semiconductor material.

17. A method of forming a semiconductor structure, the method comprising:

forming a first semiconductor nanowire having a first substantially rectangular cross-sectional area, and having a first height between a first bottom surface and a first top surface thereof on a substrate;

forming a second semiconductor nanowire having a second substantially rectangular cross-sectional area, and having a second height between a second bottom surface and a second top surface thereof on said substrate, wherein said second bottom surface is coplanar with said first bottom surface, and said second height is greater than said first height; and forming a first top semiconductor portion having said first height between a third bottom surface and a third top surface thereof and a second top semiconductor portion having said second height between a fourth bottom surface and a fourth top surface thereof over an insulator layer in said substrate, wherein each of said first semiconductor nanowire and said second semiconductor nanowire comprises a single crystalline semiconductor material, and wherein said third top surface is coplanar with said first top surface and said fourth top surface is coplanar with said second top surface.

18. The method of claim 17, further comprising:

forming a first stress-generating material layer surrounding said first semiconductor nanowire and applying a first longitudinal stress to said first semiconductor nanowire along a lengthwise direction; and forming a second stress-generating material layer surrounding said second semiconductor nanowire and applying a second longitudinal stress to said second semiconductor nanowire along a lengthwise direction, wherein one of said first longitudinal stress and said second longitudinal stress is a compressive stress and the other of said first longitudinal stress and said second longitudinal stress is a tensile stress.

19. The method of claim 18, wherein said first semiconductor nanowire has a first pair of horizontal surfaces and a first pair of nanowire sidewalls, wherein said second semiconductor nanowire has a second pair of horizontal surfaces and a second pair of nanowire sidewalls, wherein said first and second pairs of horizontal surfaces have a first surface orientation, and wherein said first and second pairs of nanowire sidewalls have a second surface orientation.

20. The method of claim 19, wherein said single crystalline semiconductor material has a greater electron mobility in said first pair of horizontal surfaces than in said first pair of nanowire sidewalls and has a greater hole mobility in said second pair of nanowire sidewalls than in said second pair of horizontal surfaces.

21. The method of claim 20, wherein said first longitudinal stress is a tensile stress and said second longitudinal stress is a compressive stress.

22. The method of claim 19, wherein said single crystalline semiconductor material has a greater hole mobility in said first pair of horizontal surfaces than in said first pair of nanowire sidewalls and has a greater electron mobility in said second pair of nanowire sidewalls than in said second pair of horizontal surfaces.

23. The method of claim 22, wherein said first longitudinal stress is a compressive stress and said second longitudinal stress is a tensile stress.

* * * * *